(12) United States Patent
Shei et al.

(10) Patent No.: US 7,205,648 B2
(45) Date of Patent: Apr. 17, 2007

(54) FLIP-CHIP LIGHT EMITTING DIODE PACKAGE STRUCTURE

(75) Inventors: Shih-Chang Shei, Tainan (TW); Jinn-Kong Sheu, Jiangjyun Township, Tainan County (TW)

(73) Assignee: South Epitaxy Corporation, Tainan (TW)

( * ) Notice: Subject to any disclaimer, the term of this patent is extended or adjusted under 35 U.S.C. 154(b) by 0 days.

(21) Appl. No.: 10/826,805

(22) Filed: Apr. 16, 2004

(65) Prior Publication Data

US 2005/0087866 A1    Apr. 28, 2005

(30) Foreign Application Priority Data

Oct. 28, 2003   (TW) .............. 92129869 A

(51) Int. Cl.
    *H01L 23/04*    (2006.01)
(52) U.S. Cl. .............. 257/698; 257/692; 257/699; 257/738
(58) Field of Classification Search ........ 257/622–623, 257/690, 692, 698–700, 738, 780, 784
    See application file for complete search history.

(56) References Cited

U.S. PATENT DOCUMENTS

| | | | | |
|---|---|---|---|---|
| 4,984,358 | A * | 1/1991 | Nelson ................ | 438/109 |
| 6,483,184 | B2 * | 11/2002 | Murata ................ | 257/698 |
| 6,614,103 | B1 * | 9/2003 | Durocher et al. ........ | 257/678 |
| 6,720,664 | B1 * | 4/2004 | Teng et al. ............ | 257/778 |
| 6,724,083 | B2 * | 4/2004 | Ohuchi et al. .......... | 257/734 |

* cited by examiner

*Primary Examiner*—Ori Nadav
(74) *Attorney, Agent, or Firm*—J. C. Patents

(57) ABSTRACT

A flip-chip LED package structure is disclosed. The flip-chip LED package structure includes a submount, patterned conductive films, a LED chip and two bumps. Several grooves are formed on the sidewalls of the submount. The patterned conductive films are formed on the grooves. The patterned conductive films extend from the grooves to parts of a top surface and a backside surface of the submount. The bumps are formed on two electrodes of the LED chip. The LED chip is disposed on the submount and connects electrically with the patterned conductive films via the bumps. The flip-chip LED package structure is disposed on a circuit board and connects electrically with the circuit without the wire bonding.

13 Claims, 5 Drawing Sheets

FLIP-CHIP LIGHT EMITTING DIODE PACKAGE STRUCTURE

CROSS-REFERENCE TO RELATED APPLICATION

This application claims the priority benefit of Taiwan application serial no. 92129869, filed on Oct. 28, 2003.

BACKGROUND OF THE INVENTION

1. Field of the Invention

The present invention relates to a semiconductor light emitting device, and more particularly to a flip-chip light emitting diode package structure.

2. Description of the Related Art

Light Emitting Diode (LED), fabricated with a semiconductor material of the Group III–V compound, can generate light, ranging from IR (infrared) to UV (ultraviolet). Recently, because of the development of the GaN blue/green LED, full color diode display and the other application can be implemented.

A LED device is basically formed with a P-type or an N-type epitaxial layer of the Group III–V compound and an active layer, i.e. a emitting layer. The efficiency of the LED device depends on the internal quantum efficiency of the active layer and the light extraction efficiency of the device. The quantum efficiency can be improved by changing the epitaxial layer structure and the quality of the epitaxial layer. The improvement of the light extraction efficiency can be achieved by reducing the reflection in the diode.

Traditionally, the electrodes of the GaN/sapphire LED are on the same surface. Because the electrodes block light, the GaN/sapphire LED usually uses a flip-chip package structure so that the light emits through the transparent sapphire substrate. Reflective layer is also formed on the epitaxial layer for reflecting most of the light to another side of the electrodes. Another advantage of the flip-chip package structure is that when an appropriate surmount, such as, an aluminum nitride submount, is applied, the thermal dispersion of the device can be improved under a high current operation. Therefore, the light extraction efficiency can be improved and the quantum efficiency of the active layer will not be degraded resulting from the thermal problem.

FIG. 1A is a schematic cross-sectional view showing a prior art flip-chip LED package structure. Referring to FIG. 1A, the package structure comprises a submount 100 and a LED chip 102, wherein the submount 100 includes bonding pads 104 and the LED chip 102 has bumps 106 thereon. When the LED chip 102 is flipped and disposed on the submount 100, the LED chip 102 electrically connects with the bonding pads 104 of the submount 100 via the bumps 106.

FIG. 1B is a schematic cross-sectional view showing a prior art structure of a flip-chip LED package structure on a circuit board. Referring to FIG. 1B, the flip-chip LED package structure is disposed on the circuit board 108 by wire bonding thereby connecting the conductive wire 112 with the bonding pads 104 and with the electrodes 110 of the circuit board 108. Therefore, the LED chip 102 electrically connects with the circuits of the circuit board 108 via the bumps 106 and the conductive wire 112.

However, because of the shrinkage of the width of the conductive wire 112, the conductive wire 112 becomes fragile and is easily broken during the process. The manufacturing cost thereby increases. Moreover, because a plurality of LED package structures is disposed on the board 108, multiple wire bonding are required and the cost is increased.

In addition, in a flip-chip LED package structure, the LED chip 102 is flipped on the submount 100 for electrically connecting therewith by the bumps 106. Therefore, the size of the prior art flip-chip LED package structure is big.

SUMMARY OF THE INVENTION

Therefore, an object of the present invention is to provide a flip-chip light emitting diode package structure serving electrical connection between a substrate and a board without wire bonding.

The object of the present invention is to provide a flip-chip light emitting diode package structure that has a small size.

The present invention discloses a flip-chip light emitting diode package structure, which comprises a submount, a first and a second patterned conductive film, a light emitting diode (LED) chip and two bumps. The submount has a first surface and a second surface opposite to the first surface, and a plurality of grooves on sidewalls thereof. The grooves can be on the same sidewall or on different sidewalls, or on the sidewall corner. The number of the grooves on each sidewall can be equal or different.

The first patterned conductive film is disposed on parts of the first surface, the second surface and a part of the inner wall of the grooves. The second patterned conductive film is disposed on parts of the first surface, the second surface and a remaining part of the inner wall of the grooves. The first and the second conductive films are not next to each other.

The light emitting diode (LED) chip is disposed on the submount and has two electrodes thereon. The bumps are disposed between the electrodes of the LED chip and the first and the second patterned conductive films for electrically connecting the LED chip with the first and the second patterned conductive films.

Additionally, the present invention discloses another flip-chip light emitting diode package structure, which comprises a submount, a first patterned conductive reflection film and a second patterned conductive reflection film, a light emitting diode (LED) chip and two bumps. The submount has a first surface and a second surface opposite to the first surface. The submount also includes an indentation on the first surface thereof. The sidewall and the bottom of the indentation form an obtuse angle.

The sidewalls of the submount have a plurality of grooves. The grooves can be on the same sidewall or on different sidewalls. Furthermore, they can be on the sidewall corner. The number of the grooves on each sidewall can be equal or different.

The first patterned conductive reflection film is disposed on portions of the first surface, the second surface, a first sidewall and the bottom of the indentation and the inner wall of the grooves. The second patterned conductive reflection film is disposed on parts of the first surface, the second surface, a second sidewall and the bottom of the indentation, and the inner wall of the grooves. Moreover, the first and the second patterned conductive reflection films are not next to each other.

The light emitting diode (LED) chip is disposed inside the indentation of the submount. The bumps are disposed between the electrodes of the LED chip and the first and second patterned conductive reflection films for electrically connecting the LED chip with the first and second patterned conductive reflection films, respectively.

The present invention provides forming grooves on the sidewalls of the submount of the LED package structure and forming conductive films on the grooves. In other words, the conductive films are formed also on the top and backside surfaces. Therefore, when the LED package structure of the present invention is disposed on a circuit board, the conductive film on the backside surface of the submount electrically connects with the electrode of the circuit board for electrically connecting the LED chip with the circuits of the circuit board via the bumps without wire bonding. Accordingly, the manufacturing cost is lower.

In a preferred embodiment of the present invention, because the LED chip is inside the indentation of the submount, the size of the package structure can be reduced. Moreover, the light from the LED in the indentation can be reflected by the conductive reflection films on the sidewalls of the indentation and is being emitted collectively to the outside of the indentation. The present invention, therefore, can improve the efficiency of the LED.

In order to make the aforementioned and other objects, features and advantages of the present invention understandable, a preferred embodiment accompanied with figures is described in detail below.

DESCRIPTION OF SOME EMBODIMENTS

Figure 1A:
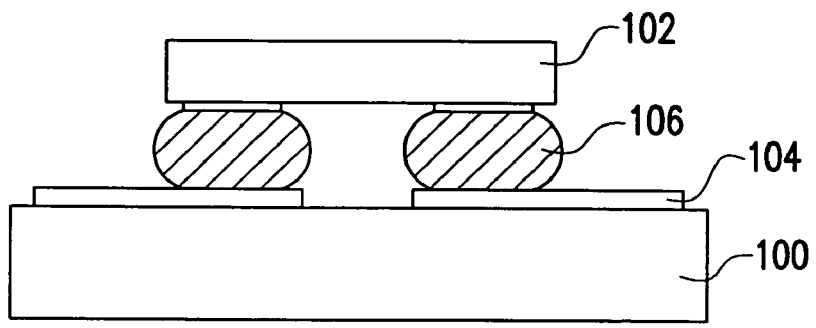
FIG. 1A is a schematic cross-sectional view showing a prior art flip-chip LED package structure.
Figure 1B:
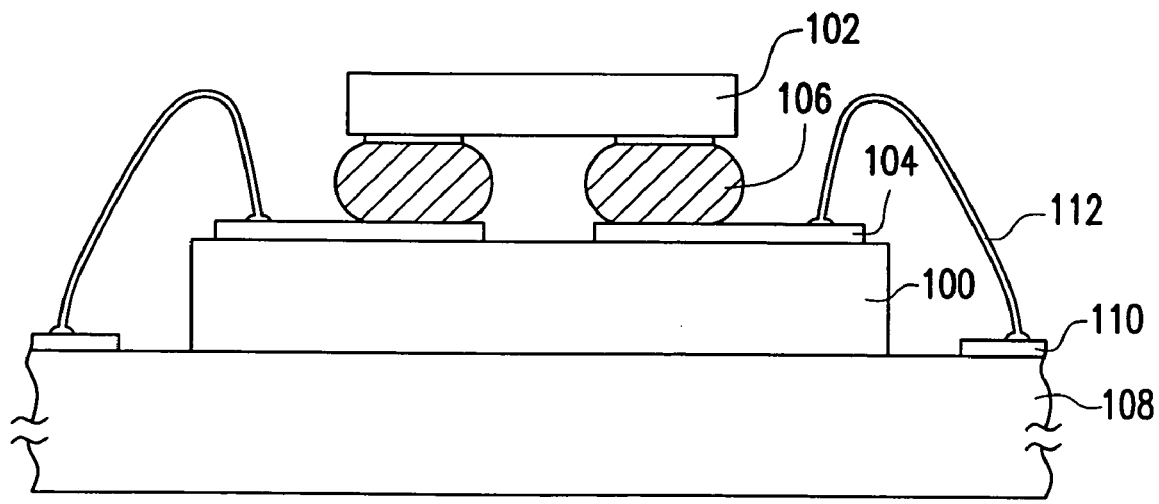
FIG. 1B is a schematic cross-sectional view showing a prior art structure of a flip-chip LED package structure on a circuit board.
Figure 2A:
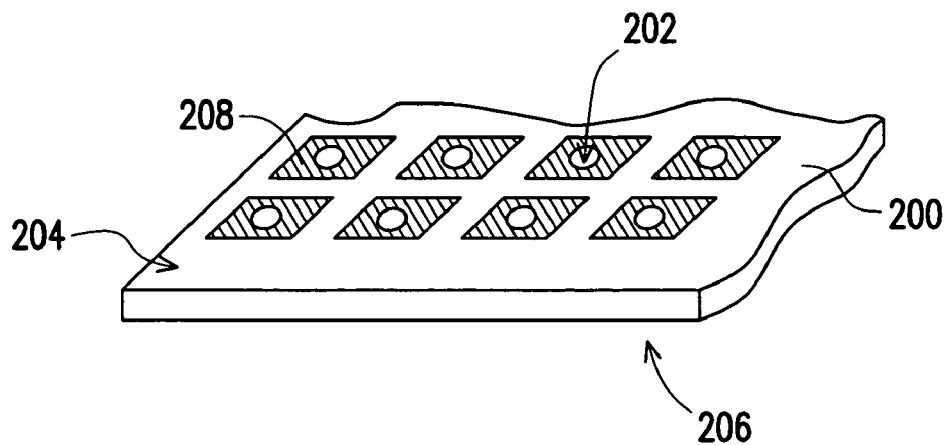
FIGS. 2A and 2B are schematic cross-sectional views showing the progression of steps for fabricating a flip-chip light emitting diode (LED) package structure according to a first preferred embodiment of the present invention.
Figure 2B:
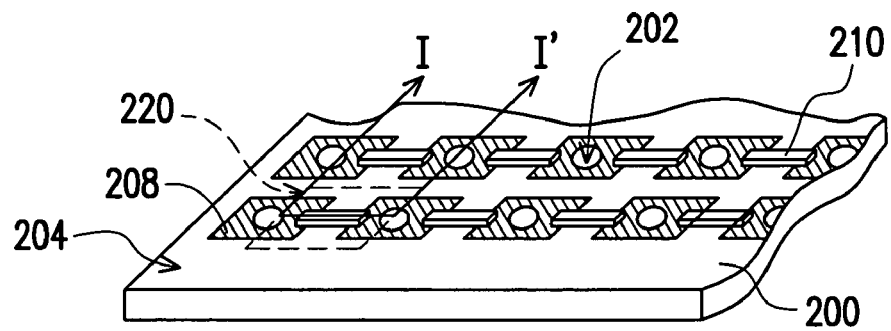
Figure 2C:
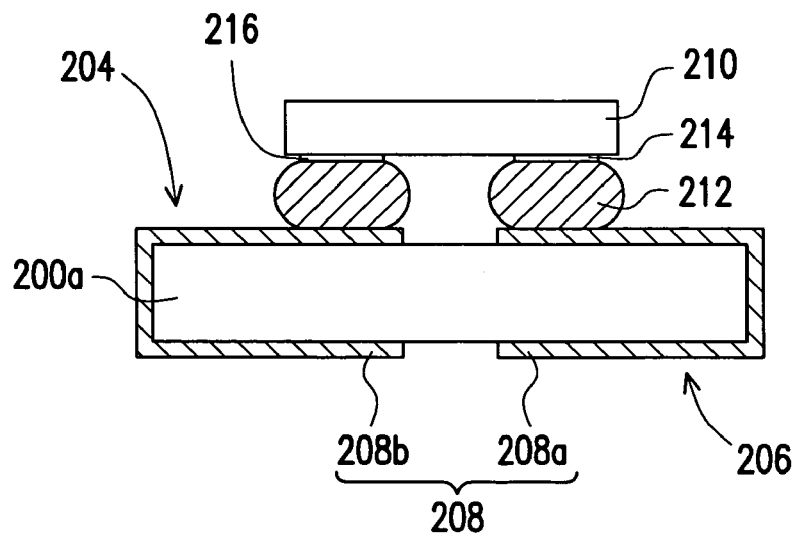
FIG. 2C is a cross-sectional view of FIG. 2B along the cutting line I–I'.

FIGS. 2A and 2B are schematic cross-sectional views showing the progression of steps for fabricating a flip-chip light emitting diode (LED) package structure according to a first preferred embodiment of the present invention. FIG. 2C is a cross-sectional view of FIG. 2B along the cutting line I–I'.

Referring to FIG. 2A, the method of fabricating a flip-chip LED package structure includes forming a plurality of holes 202 on a substrate 200 by a laser or a drill. The substrate 200 can be, for example, aluminum nitride, boron nitride or beryllium oxide. The substrate 200 serves as a submount of the flip-chip LED package structure. Size, shape, arrangement and distance of the holes 202 are not specified and depend on the specification of the manufacturing process.

In another preferred embodiment, a plurality of indentations (not shown) is formed on the substrate where the holes 202 are not present. The method of forming the indentations is, for example, an etching process. Detail descriptions are as followed.

A photoresist layer (not shown) is formed on the top surface 204 of the substrate 200 where a LED chip is going to be disposed thereon and on the backside surface 206. In the embodiment in which indentations are formed, the photoresist layer is formed on parts of the top and backside surfaces of the substrate and on the indentations where the LED chip is going to be disposed therein. An electroplating process is performed for coating a conductive film 208 on the substrate 200, which comprises, for example, immersing the substrate 200 into an electrolyte solution; and applying a voltage to conduct electroplating for forming a conductive film 208 on the substrate 200 and the inner wall of the holes 202. The photoresist layer is then removed to expose the part of the substrate 200 without the conductive film 208.

Referring to FIGS. 2B and 2C, the bumps 212 are formed on the anode electrode 214 and cathode electrode 216 of the LED chip 210. The bumps 212 can be, for example, a Sn—Pb alloy, a Sn—Au alloy, Au or any other conductive material. Then, a plurality of LED chips 210 is flipped and disposed on the surface 204 of the substrate 200. The bumps 212 of the LED chip 210 connect with the conductive films 208a and 208b, respectively. The LED chip 210 electrically connects with the conductive film 208 of the substrate 200 via the bumps 212.

The substrate 200 having the LED chips 210 is sawed by a laser or a mechanical cutter. It can be sawed along the mark 220 for forming each submount 200a with a LED chip 210. FIG. 2C is a cross-sectional view of the flip-chip LED package structure after being sawed.

Figure 3A:
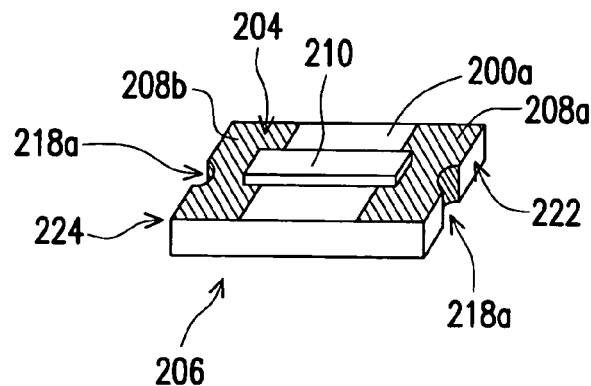
FIG. 3A is a schematic perspective view showing the flip-chip LED package structure of the first preferred embodiment of the present invention.
Figure 3B:
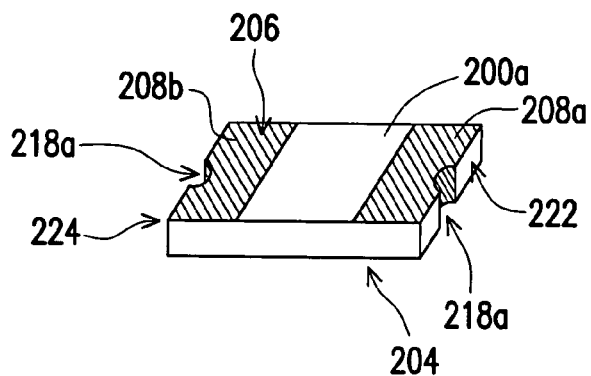
FIG. 3B is a schematic backside, perspective view of the flip-chip LED package structure of the first preferred embodiment of the present invention.

FIG. 3A is schematic perspective view showing the flip-chip LED package structure of the first preferred embodiment of the present invention. FIG. 3A is the perspective view of FIG. 2C. FIG. 3B is schematic perspective view showing the backside of the flip-chip LED package structure of the first preferred embodiment of the present invention.

Referring to FIGS. 2C, 3A and 3B, the flip-chip LED package structure comprises the submount 200a, the conductive film 208, the bumps 212 and the LED chip 210. The LED chip 210 is flipped and disposed on the submount 200a. The bumps 212 are formed between the anode electrode 214 of the LED chip 210 and the conductive films 208a, the cathode electrode 216 of the LED chip 210 and 208b for electrically connecting the LED chip 210 and the conductive films 208a and 208b via the bumps 212, respectively. The bumps 212 can be, for example, a Sn—Pb alloy, a Sn—Au alloy, Au or any other conductive material.

Two sidewalls, such as sidewalls 222 and 224, of the submount 200a have the grooves 218a and 218b respectively. The shape of the grooves 218a and 218b can be, for example, rectangular grooves, triangular grooves or cylindrical grooves. Although in this embodiment, the shape of the grooves is cylindrical, the shape of the grooves 218a and 218b is not limited thereto.

The conductive films 208a and 208b are formed on the inner wall of the grooves 218a and 218b and extend to portions of the top surface 204 and the backside surfaces 206 of the submount 200a, respectively. It should be noted that a gap exists between the conductive films 208a and 208b on the top surface 204 and the backside surface 206 of the submount 200a. The gap on the surface 204 of the submount 220a is where the LED chip is going to be disposed thereon.

It should be noted that in the preferred embodiment of the present invention, the location of the grooves of the submount 200a can be re-arranged by altering the arrangement of the holes 202, the location of the conductive film or the method of sawing the substrate 200. For example, m grooves are disposed on a sidewall of the submount 200a and n grooves are disposed on another sidewall thereof. The sidewalls can be next or opposite to each other. M can be or can be not equal to n. In this embodiment, the number of grooves formed on the opposite sidewalls is the same, and both m and n are 1.

Additionally, the grooves can be on the sidewall corner of the submount. Following are two embodiments showing the change of the location of the grooves on the submount.

Figure 6:
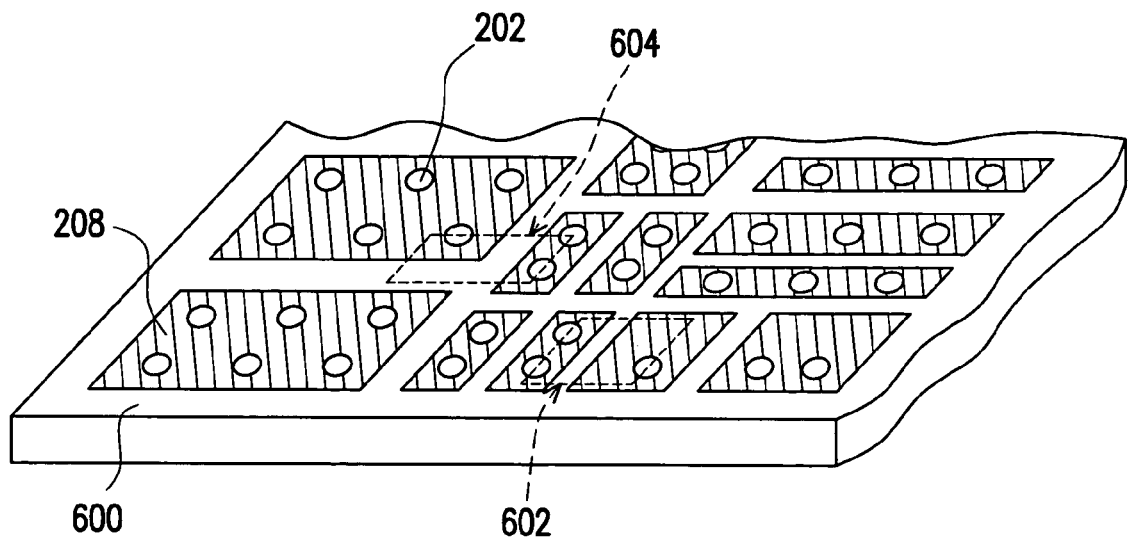
FIG. 6 is a schematic diagram illustrating the location of the conductive film on the surface of the substrate of the present invention.

Referring to FIG. 6, it is a figure showing the location of the conductive film on the surface of the substrate of the present invention. The substrate 600 includes a plurality of holes 202 and the conductive film 208. In the subsequent process, the substrate 600 is sawed along the mark 602 for forming the submount shown in FIG. 7A.

Figure 7A:
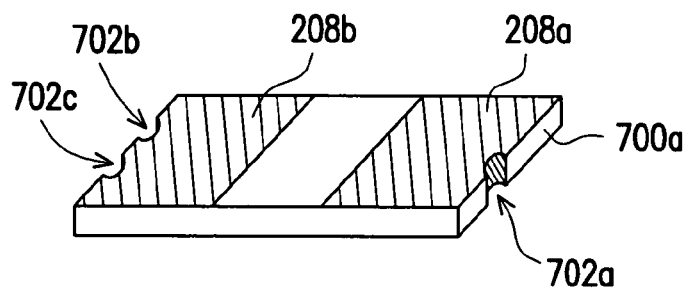
FIG. 7A is a schematic diagram of a submount structure with a conductive film according to an embodiment of the present invention.

Referring to FIG. 7A, the grooves 702a, 702b and 702c are on the sidewalls of the submount 700a, opposite to each other. The grooves 702b and 702c are disposed on the same sidewall, which is opposite to the sidewall where the grooves 702a are disposed thereon. Additionally, the conductive film 208a is formed on portions of the groove 702a, the top and backside surfaces of the submount 700a. The conductive film 208b is formed on parts of the inner wall of the groove 702b and groove 702c, the top and backside surfaces of the submount 700a. When the LED chip (not shown) is disposed on the submount 700a, two electrodes of the LED chip electrically connect with the conductive films 208a and 208b via bumps (not shown).

Figure 7B:
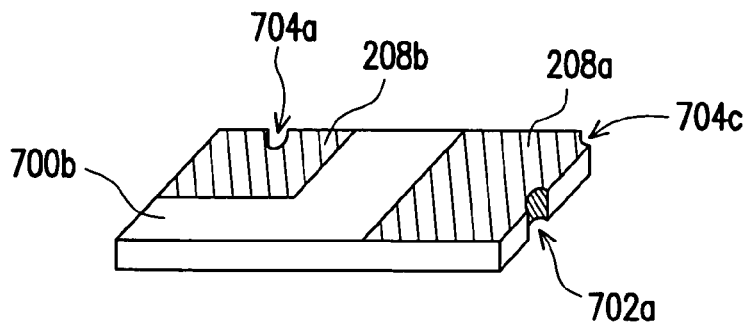
FIG. 7B is a schematic diagram of a submount structure with a conductive film according to another embodiment of the present invention.

Referring to FIG. 6, during the subsequent process, the substrate 600 is sawed along the mark 604 for forming the submount shown in FIG. 7B. Referring to FIG. 7B, the grooves 704a and 704b are on the sidewalls of the submount 700b which are next to each other, and the groove 704c is disposed on the sidewall corner of the submount 700b. The conductive film 208a is formed on parts of the inner wall of the grooves 704b and 704c, the top and backside surfaces of the submount 700b. The conductive film 208b is formed on parts of the inner wall of the groove 704a, the top and backside surfaces of the submount 700b. When the LED chip (not shown) is disposed on the submount 700b, two electrodes of the LED chip electrically connect with the conductive films 208a and 208b via bumps (not shown), respectively.

Figure 4:
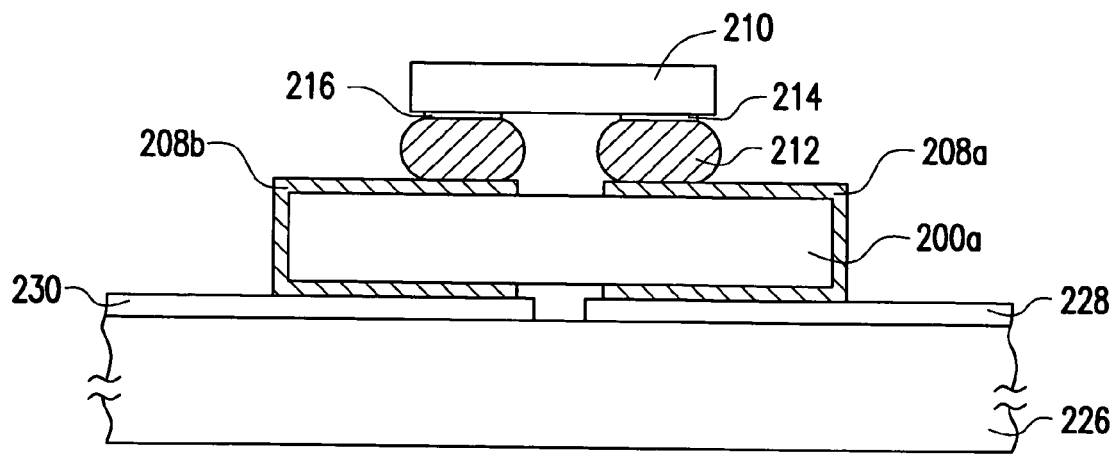
FIG. 4 is schematic cross-sectional view showing a LED package structure on a circuit board of the present invention.

FIG. 4 is schematic cross-sectional view showing a preferred LED package structure on a circuit board of the present invention. Referring to FIG. 4, the circuit board 226 has electrodes 228 and 230. When the LED package structure is disposed on the circuit board 226, the conductive film 208 on the backside surface of the submount 200a electrically connects with the electrodes 228 and 230 for electrically connecting the LED chip 210 and the circuits of the circuit board 226. Therefore, the LED package structure according to one preferred embodiment of the present invention can electrically connect the LED chip 210 and the circuits of the circuit board 226 without wire bonding. Accordingly, the manufacturing cost is reduced and the process is simplified.

Additionally, in a second preferred embodiment, an indentation is formed inside the submount for supporting the LED chip and reducing the package size. Detail descriptions are discussed as followed.

Whenever possible, the same reference numbers in the drawings and the description are used in the first and the second embodiments to refer to the same or like parts. It should be noted that a same type of material and method of formation are used in forming the same or like parts in the first and the second embodiments. Details of that will not be further reiterated.

Figure 5A:
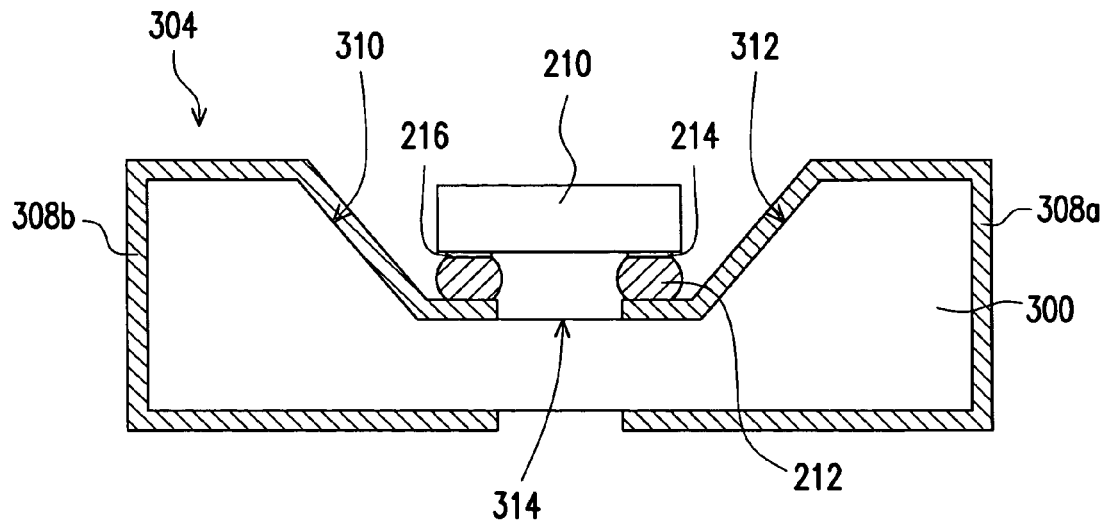
FIG. 5A is a schematic cross-sectional view of a LED package structure according to a second preferred embodiment of the present invention.
Figure 5B:
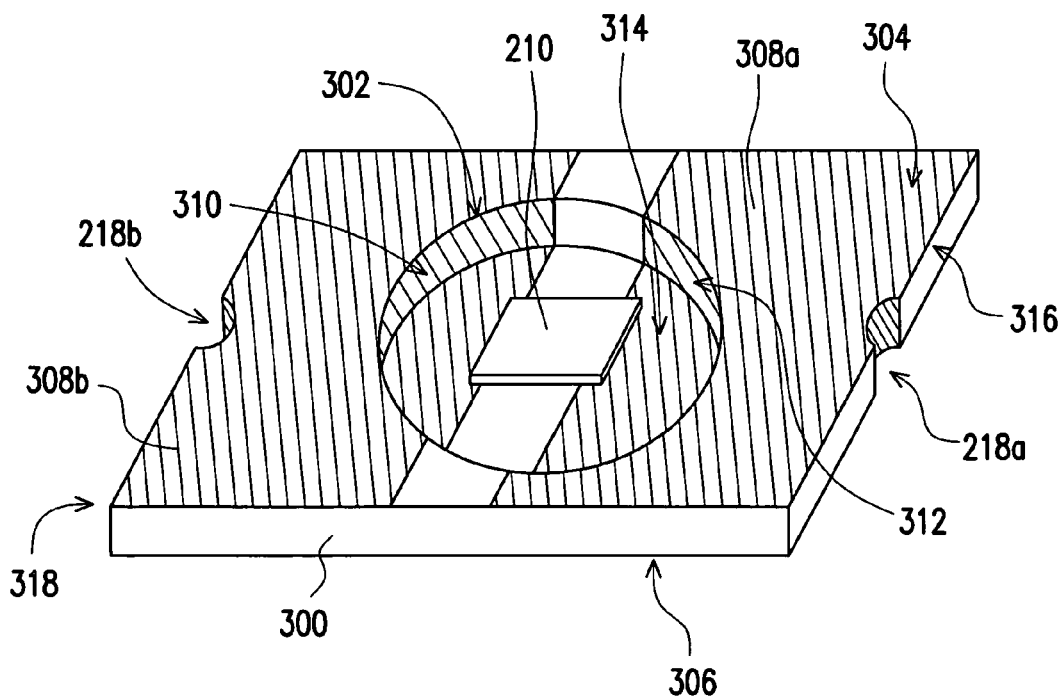
FIG. 5B is schematic perspective view of the LED package structure as shown in FIG. 5A.

FIG. 5A is a schematic cross-sectional view of a LED package structure according to a second preferred embodiment of the present invention. FIG. 5B is schematic perspective view of the LED package structure as shown in FIG. 5A.

Referring to FIGS. 5A and 5B, the flip-chip LED package structure comprises submount 300, the conductive reflection films 308a and 308b, the bumps 212 and the LED chip 210. The LED chip 210 has anode electrode 214 and cathode electrode 216 thereon. The bumps 212 are formed between the anode electrode 214 and the conductive reflection films 308a, and between the cathode electrode 216 of the LED chip 210 and the conductive reflection films 308b, respectively.

The top surface 304 of the submount 300 has an indentation 302, which is formed, for example, by an etching process or thermal press. The angle formed between the sidewalls 310 and 312 and the bottom surface 314 of the indentation 302 is preferably an obtuse angle to reflect the light emitting from LED chip 210. The LED is disposed within the indentation 302 and electrically connects with the conductive reflection films 308a and 308b at the bottom surface 314 of the indentation 302 via the bumps 212.

In addition, the submount 300 has grooves on the sidewalls thereof. For example, the grooves 218a and 218b are formed on the sidewalls 316 and 318, respectively. The shape of the grooves 218a and 218b can be, for example, rectangular grooves, triangular grooves or cylindrical grooves. Although in this embodiment, the grooves are cylindrical shape, the shape of the grooves 218a and 218b is not limited thereto.

Of course, the present invention does not specify the number of grooves on the sidewalls of the submount. In this embodiment, the number of grooves on a sidewall of the submount 200a is m and the number of grooves on another sidewall of of the submount 200a is n. The sidewalls can be next to or opposite from each other. M can be or can be not equal to n. In this embodiment, both m and n are 1.

The conductive reflection films 308a and 308b are formed on the inner wall of the grooves 218a and 218b and extend to parts of the top surface 304 and the backside surface 306 of the submount 300, and to the sidewalls 310 and 312 and the bottom surface 314 of the indentation 302. A gap exists at the bottom surface 314 of the indentation 302 and on the backside surface 206 of the submount 300 between the conductive reflection films 308a and 308b. The gap is where the LED chip 210 is going to be disposed thereon.

In this embodiment, the location of the LED chip on the circuit board is similar to that in the first embodiment. In both embodiments, the LED chip and the circuit board through the bumps and the conductive reflection films, rather than through wire bonding to reduce the manufacturing cost.

Specially, the LED chip 210 is disposed within the indentation 302 of the submount 300 in accordance to the instant invention. The sidewalls 310 and 312 of the indentation 302 have conductive reflection films 308a and 308b thereon to collectively reflect the light to outside of the indentation 302. Therefore, the brightness and efficiency of the LED are improved.

Additionally, because the LED chip 210 is disposed within the indentation 302 of the submount 300 in this embodiment, the height of the package structure is similar to that of the submount 300. Therefore, the package size can be reduced and the utility of the space of the device can be improved in accordance to the present invention.

Although the present invention has been described in terms of exemplary embodiments, it is not limited thereto. Rather, the appended claims should be constructed broadly to include other variants and embodiments of the invention which may be made by those skilled in the field of this art without departing from the scope and range of equivalents of the invention.

What is claimed is:

1. A flip-chip light emitting diode package structure, comprising:
    a submount having a first surface and a second surface opposite to the first surface, an indentation on the first surface, a plurality of grooves on a first sidewall and a second sidewall of the submount;
    a first patterned conductive reflection film disposed on a first part of the first surface, a first part of the second surface, a first part of a sidewall of the indention, a first part of a bottom of the indentation and a part of an inner wall of the grooves;
    a second patterned conductive reflection film on a second part of the first surface, a second part of the second surface, a second part of the sidewall of the indention and a second part of the bottom of the indentation, and a remaining part of the inner wall of the grooves; and
    a light emitting diode (LED) chip inside the indentation of the submount, wherein the LED chip has two electrodes electrically connecting with the first patterned conductive reflection film and the second patterned conductive reflection film, respectively,
    wherein the first patterned conductive reflection film and the second patterned conductive reflection film cover the entire first surface except for a narrow insulation gap between the first patterned conductive reflection film and the second patterned conductive reflection film.

2. The flip-chip light emitting diode package structure of claim 1, further comprising two bumps disposed between the electrodes of the LED chip, and the first patterned conductive reflection film and the second patterned conductive reflection film.

3. The flip-chip light emitting diode package structure of claim 1, wherein m is a number of the grooves that are on the first sidewall of the submount and n is a number of the grooves that are on the second sidewall of the submount, wherein at least one of m and n is greater than or equal to two.

4. The flip-chip light emitting diode package structure of claim 3, wherein the first and the second sidewalls are next to each other.

5. The flip-chip light emitting diode package structure of claim 3, wherein the first and the second sidewalls are opposite to each other.

6. The flip-chip light emitting diode package structure of claim 3, wherein m is not equal to n.

7. The flip-chip light emitting diode package structure of claim 3, wherein m is equal to n.

8. The flip-chip light emitting diode package structure of claim 3, wherein m is 1 and n is 1.

9. The flip-chip light emitting diode package structure of claim 1, wherein the grooves are disposed on a sidewall at a corner of the submount.

10. The flip-chip light emitting diode package structure of claim 2, wherein the bumps comprise a Sn—Pb alloy, a Sn—Au alloy or Au.

11. The flip-chip light emitting diode package structure of claim 1, wherein the submount comprises a material selected from the group consisting of aluminum nitride, boron nitride or zinc oxide.

12. The flip-chip light emitting diode package structure of claim 1, wherein an angle formed between the sidewall and the bottom of the indentation is an obtuse angle.

13. The flip-chip light emitting diode package structure of claim 1, wherein at least one of m and n is greater than 1.

* * * * *